United States Patent [19]

Yamaguchi et al.

[11] Patent Number: 4,550,310
[45] Date of Patent: Oct. 29, 1985

[54] TOUCH SENSING DEVICE

[75] Inventors: Hisashi Yamaguchi, Hyogo; Toru Asano, Kobe; Kazuhiro Takahara, Akashi; Keizo Kurahashi, Sagamihara; Shizuo Andoh, Akashi, all of Japan

[73] Assignee: Fujitsu Limited, Kawasaki, Japan

[21] Appl. No.: 437,220

[22] Filed: Oct. 28, 1982

[30] Foreign Application Priority Data

Oct. 29, 1981 [JP] Japan .............................. 56-174029
Feb. 25, 1982 [JP] Japan .............................. 57-030235

[51] Int. Cl.$^4$ .......................... G06F 3/02; H01H 35/00
[52] U.S. Cl. .......................... 340/365 C; 200/DIG. 1; 307/116; 340/365 S
[58] Field of Search ............... 340/365 C, 365 S, 712; 200/DIG. 1; 361/288, 290, 280; 307/116; 400/479.1

[56] References Cited
U.S. PATENT DOCUMENTS

| | | | |
|---|---|---|---|
| 2,782,308 | 2/1957 | Rug | 340/365 C |
| 3,281,541 | 10/1966 | Learner | 340/365 C |
| 3,492,440 | 1/1970 | Cerbone | 340/365 C |
| 3,691,555 | 9/1972 | Looschen | 340/365 C |
| 4,027,306 | 5/1977 | Hackmeister | 340/365 C |

FOREIGN PATENT DOCUMENTS

| | | | |
|---|---|---|---|
| 52-28993 | 7/1977 | Japan . | |
| 2026745 | 2/1980 | United Kingdom | 340/365 C |

Primary Examiner—James J. Groody
Attorney, Agent, or Firm—Armstrong, Nikaido, Marmelstein & Kubovcik

[57] ABSTRACT

A new type touch sensing device comprises a touch panel with a plurality of transparent touch electrodes, a LC parallel resonant circuit connected to the touch electrode and an oscillation circuit. The LC resonant circuit has a resonant point on a same frequency with the oscillation frequency of the oscillation circuit. The touch/non-touch condition to the touch electrode is detected as a change of voltage value at the connecting point of the LC resonant circuit and touch electrode with an increased ON-OFF ratio.

2 Claims, 17 Drawing Figures

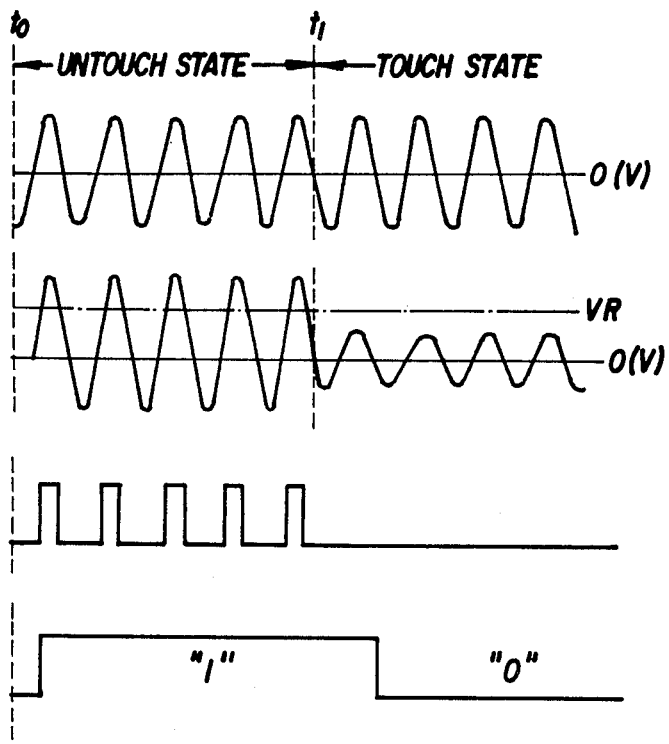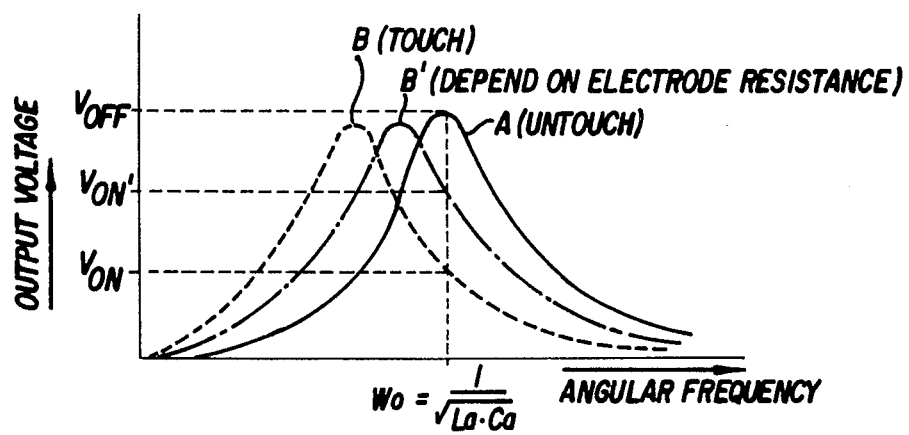

TOUCH SENSING DEVICE

BACKGROUND OF THE INVENTION

1. Field of the Invention

This invention relates to an improvement in the see-through type finger touch sensing device which is provided on the display screen and is used for inputting the data in the area designated by finger into the computer system, in more specifically, to a new type touch sensing device which detects change of capacitance of touch electrode due to finger touch using the resonant phenomenon of the resonant circuit.

2. Description of the Prior Arts

A see-through type touch keyboard is well known as the man-machine interface unit which is mounted to the display screen of display unit and is used for inputting the data in the area designated by finger touch to the computer system. For the touch keyboard of this kind, it is important factor to accurately detect the touch condition and various methods have been proposed. As the one of such touch sensing systems, a change of capacitance between the touch electrode and ground by finger touch is detected and this method is explained, for example, in the U.S. Pat. No. 3,482,241 and the U.S. Pat. No. 3,971,013. However, such existing method has disadvantages that a ratio of touch and non-touch conditions (ON-OFF ratio) is insufficient and misoperation occurs easily.

SUMMARY OF THE INVENTION

It is a principal object of the present invention to provide a touch sensing device which can accurately and stably detect the touch condition to the touch electrode.

It is another object of the present invention to provide a highly reliable see-through type touch keyboard which is mounted on the display screen and is capable of generating desired coordinate information on the display screen in accordance with designation by finger touch.

It is further object of the present invention to provide a touch sensing system which assures a large output signal ratio in the touch and non-touch conditions (ON-OFF ratio) and allows less misoperations.

Briefly, in order to attain above objects, the present invention discloses a touch sensing device which detects the touch condition to the touch electrode using a fact that capacitance of pertient touch electrode changes depending on the touch and non-touch condition to the touch electrode, wherein the oscillating circuit which generates an AC signal having a predetermined frequency is connected to said touch electrode via the impedance circuit element, the resonant circuit tuned the frequency of said AC signal is connected between said touch electrode and ground, and thereby the touch/non-touch condition to the touch electrode is detected as a change of signal voltage value at the connecting point of said impedance circuit and the resonant circuit.

According to another characteristic of the present invention, the resonant circuit connected between said touch electrode and the ground is configurated as the parallel resonant circuit, moreover an element which forms a series resonant circuit together with an equivalent circuit element added by the touch operation to said touch electrode is also connected between said parallel resonant circuit and the touch electrode. Such structure contributes significantly to realization of further increased ON-OFF ratio.

BRIEF DESCRIPTION OF THE DRAWINGS

FIG. 3 is the time chart for explaining the touch condition sensing operation.

FIG. 4 is the characteristic curve indicating relation between frequency and detected output voltage in the embodiment of FIG. 2.

DESCRIPTION OF THE PREFERRED EMBODIMENTS

Figure 1:
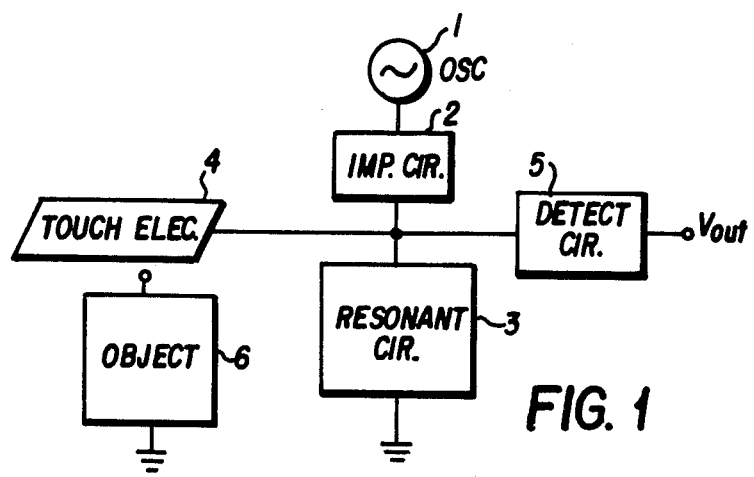
FIG. 1 is the block diagram indicating the composition based on the principle of the touch sensing device of the present invention.

FIG. 1 is the block diagram indicating outline of the touch sensing device of the present invention. The oscillator 1 which sends an alternate signal of a constant frequency is connected with the resonant circuit 3 via the impedance circuit 2 and the other end of said resonant circuit 3 is grounded. The connecting point of the impedance circuit 2 and the resonant circuit 3 is connected to the touch electrode 4 via the lead wire and also connected to the voltage detecting circuit 5. Reference numeral 6 indicates an object to be detected and generally a part of a human body is selected as such object.

Figure 2:
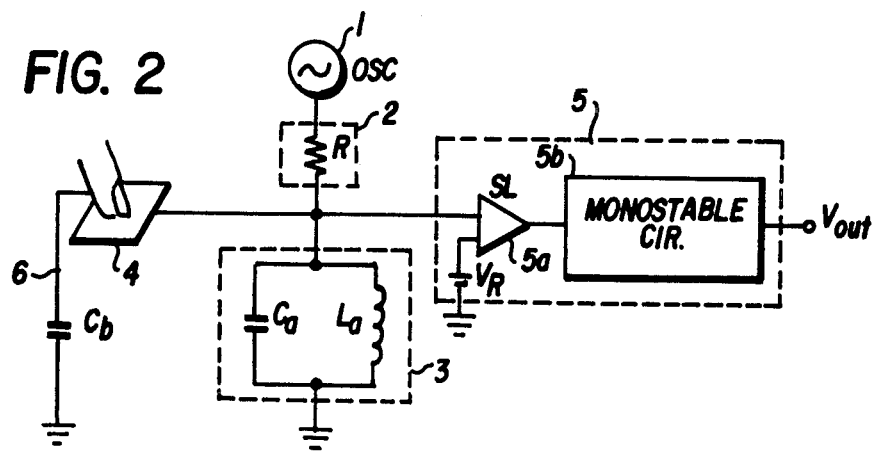
FIG. 2 shows circuit composition of the one embodiment of the present invention concretely indicating the block diagram of FIG. 1.

FIG. 2 is an example of circuit indicating details of each circuit of FIG. 1. The impedance circuit 2 is, in this example, composed of a resistor R and it may be replaced with other discrete element or combination of elements. The resonant circuit 3 is composed of an LC parallel resonant circuit where a capacitor $C_a$ and coil $L_a$ are connected in parallel. The voltage detecting circuit 5 is composed of the slice circuit 5a and the monostable circuit 5b. The slice circuit 5a slices an input signal with a constant level and sends an output to the monostable circuit 5b. This monostable circuit 5b operates in such a manner that it outputs the signal "1" having the specified width (duration) from the timing where the level of input signal varies from "0" to "1" and moreover outputs further the signal "1" having the specified width when an input varies again from "0" to "1" while an output "1" is being obtained. Namely, said monostable circuit is so-called re-start type monostable circuit. A human body which can be placed in contact with the touch electrode 4 can be equivalently represented by a capacitance Cb.

Here, considered is the case that a human body 6 is not in contact with the touch electrode 4 in the circuit composition shown in FIG. 2. In such a case, an impedance $Z_{off}$ of the LC parallel resonant circuit 3 is generally expressed by the following equation (1).

$$Z_{off} = Jw_o La/(1-w_o^2 \cdot La \cdot Ca) \qquad (1)$$

Where the inductance of coil $L_a$ is La[H], capacitance of capacitor Ca is Ca[F].

Here, when the relation between the angular frequency $w_o$ of the oscillator 1 and values of elements La, Ca are selected as shown by the equation (2), $$w_o = 1/\sqrt{La \cdot Ca} \qquad (2)$$

the LC parallel resonant circuit 3 enters the resonant condition, an impedance $Z_{off}$ becomes infinitive and as a result an output voltage $V_{out}$ becomes almost equal to an output voltage of the oscillator 1.

On the other hand, when considering the case where a human body 6 comes to contact with the touch electrode 4, an impedance $Z_{on}$ of the LC resonant circuit 3 can be expressed by the equation (3) since a capacitance of a human body Cb is added.

$$Z_{on} = Jw_o La/[1-w_o^2 La(Ca+Cb)] \qquad (3)$$

where Cb is a value of capacitance of human body.

Therefore an output voltage $V_{out}$ at this time can be expressed by the following equation.

$$V_{out} = Z_{on} V_s/(R+Z_{on}) \qquad (4)$$

Where R is a resistance value of resistor R and Vs is an output voltage of oscillator.

Thus, a ratio of the output voltage $V_{off}$ obtained in the non-touch condition and an output voltage $V_{on}$ obtained in the touch condition is expressed as follow.

$$V_{off} : V_{on} = 1 : Z_o/(R+Z_{on}) \qquad (5)$$

Consequently, a large ON-OFF ratio can be obtained by adequately selecting the values of R, Ca, Cb and La.

Actually, in the composition of FIG. 2, the LC parallel resonant circuit 3 is designed so that it has the resonant frequency same as the frequency, for example, of 30 kHz sent from the oscillator 1 and it shows theoretically an infinitive impedance in the non-touch condition. Therefore, in case an AC voltage as shown in FIG. 3(A) is output from the oscillator 1, a voltage $V_{off}$ which is almost equal to the oscillation output voltage is applied to the slicer circuit 5a as shown in the period $t_0$ to $t_1$ of FIG. 3(B) in the non-touch condition. As a result, the signal higher than the reference voltage VR is output from the slicer circuit 5a as shown in FIG. 3(C) and it is input to the monostable circuit 5. Therefore, an output of said monostable circuit becomes logic "1" as shown in FIG. 3(D) during this period.

When a human body touches the touch electrode 4 at the timing $t_1$ in FIG. 3, the resonant circuit 3 changes to non-resonant condition from the resonant condition because a capacitance of human body Cb is added. Thus, an input of the voltage detecting circuit 5, namely voltage at the connecting point of the impedance circuit 2 and the resonant circuit 3 becomes smaller than the reference voltage VR as shown in FIG. 3(B). Therefore, the monostable circuit 5b is not started and its output voltage $V_{out}$ becomes logic "0" as shown in FIG. 3(D).

The touch and non-touch conditions can be sensed as a change of voltage at the connecting point of the impedance circuit 2 and the resonant circuit 3 by changing the resonant condition of the resonant circuit depending on touch and non-touch conditions of a human body to the touch electrode 4.

FIG. 4 shows profile of a change of output voltage due to a change of capacitance of touch electrode as a change of the resonant characteristic. In the non-touch condition, the resonant point of the parallel resonant circuit 3 matches the angular frequency $w_o$ of the oscillator 1 and thereby the maximum output voltage $V_{off}$ can be obtained on a resonant curve A. Meanwhile, when a capacitance Cb of a human body is added by the finger touch operation to the touch electrode, the resonant point of parallel resonant circuit deviates to the lower frequency side like a curve B and consequently an output voltage lowers to the level of $V_{on}$ for the fixed oscillation frequency of the oscillator 1.

Figure 5A:
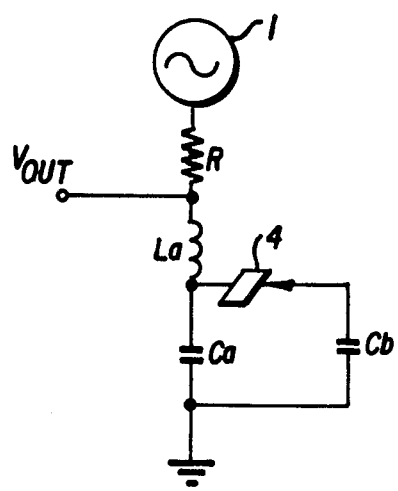
FIGS. 5A and 5B show a modified circuit composition of the detecting circuit.

Basically, this invention is capable of recognizing the touch condition from a difference of output voltages $V_{off}-V_{on}$ in the finger touch and non-touch condition based on deviation of resonant point as explained above. Therefore, as a resonant circuit which shows the resonant point, or deviation of impedance, not only the LC parallel circuit as shown in above FIG. 2 but also the circuit having other resonant characteristic can be used. FIG. 5(A) shows an embodiment using a series resonant circuit, where a resistor R, coil La, capacitor Ca are connected in series between the oscillator 1 and the ground, while the touch electrode 4 is connected between the coil La and capacitor Ca. In case an inductance of coil La and capacitance of capacitor Ca are selected so that they resonate to the oscillation frequency of the oscillator 1, the resonant impedance of this series resonant circuit becomes zero, in opposite to the parallel resonance.

Therefore, in the no-finger-touch condition, an output voltage $V_{out}$ (=$V_{off}$) becomes the ground level since the LC series resonant circuit is in the resonant condition, and meanwhile, when a capacitance of human body Cb is added by the finger-touch condition, the resonant condition deviates and an output voltage $V_{out}$ increases up to the level $V_{on}$. The touch condition to the touch electrode can be sensed by detecting such output voltage $V_{on}$.

Figure 5B:
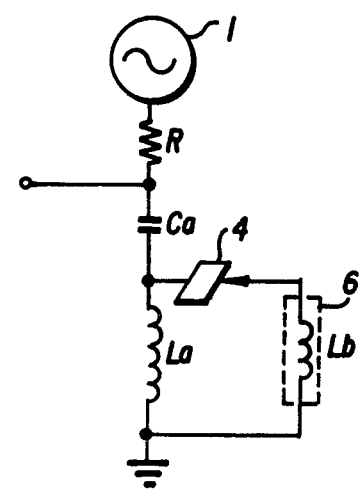

In addition, the specimen 6 in FIG. 1 is not limited only to that having a capacitance Cb of human body as mentioned above but also to that deviating the resonant point of the resonant circuit 3, particularly of the series resonant circuit of the capacitor Ca and coil La by making contact the coil Lb to the touch electrode 4 as shown in FIG. 5(B). Namely, a speciment can be formed by any means which causes some changes on the resonant condition of the resonant circuit depending on the touch and no-touch conditions to the touch electrode. Considered, as an example, is a means where a coil or capacitor of which one end is earthed is housed in the pen-shaped case and the other end is placed in contact with the touch electrode.

The theoretical composition of this invention has been explained mainly based on the discrete touch sensing device.

However, this invention is principally intended to realize a touch input device or touch keyboard having plurality of sensing points for man-machine interface and such application examples are explained below in detail.

Figure 6:
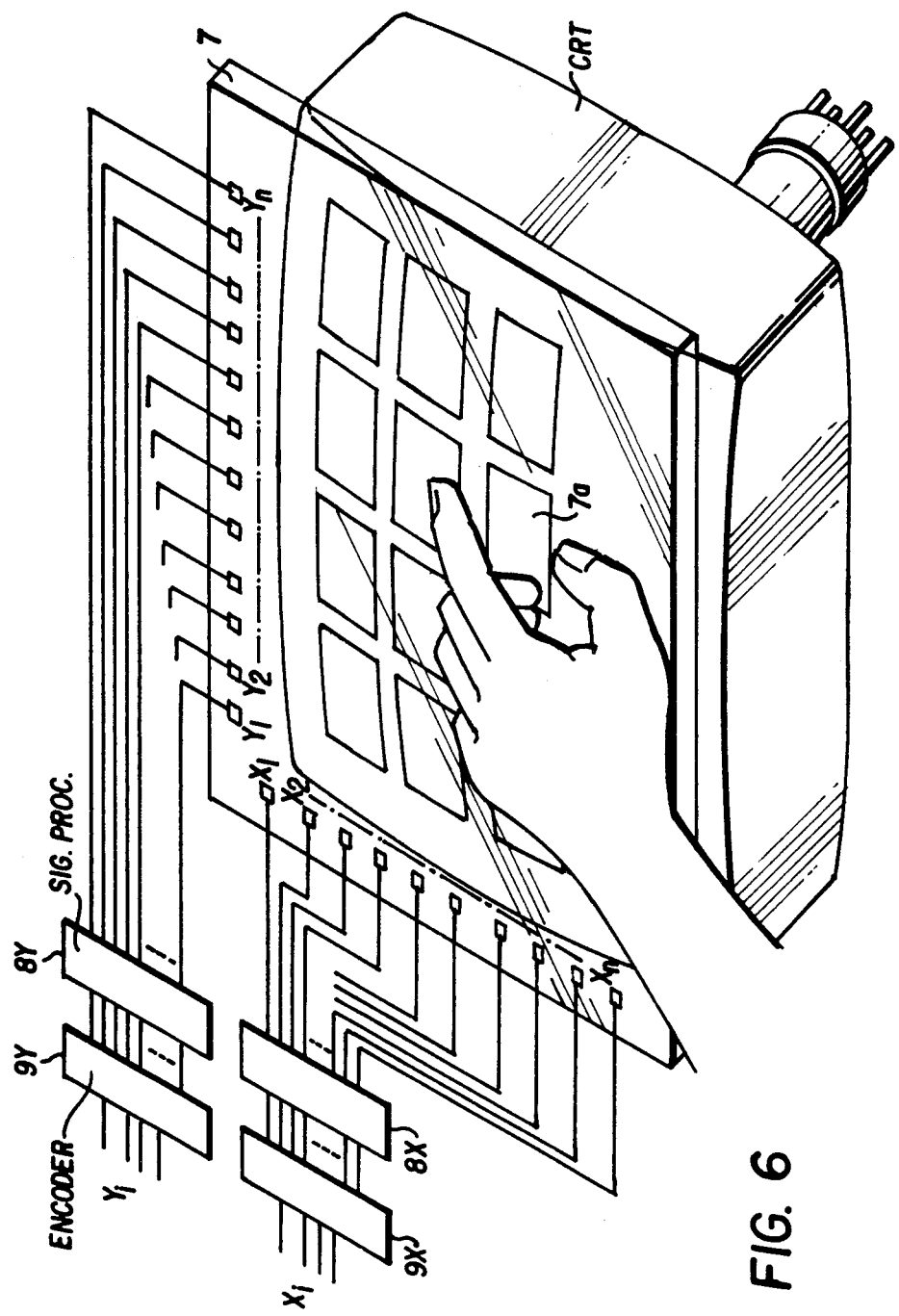
FIG. 6 is a perspective view indicating outline of composition in case the touch sensing device of the present invention is provided on the display as the touch keyboard.

FIG. 6 shows a perspective view of a touch sensing device comprising the see-through type touch keyboard composition installed on the surface of CRT display. This keyboard detects the data of designated location corresponding to the item displayed on the CRT and then inputs it to a computer and it composed of the see-through touch panel 7, sensed signal processors 8X, 8Y and encoders 9X, 9Y. The touch panel 7 provides plurality of X side detecting electrodes X1–Xm arranged in X direction, plurality of Y side detecting electrodes Ya–Yn arranged in Y direction and plurality of touch electrode area 7a defined at the intersecting points of said X and Y electrodes. The sensed signal processors 8X, 8Y provide respectively the oscillator, resonant circuit and voltage detecting circuit as explained above and input voltage levels of X and Y detecting electrodes to the encoders 9X and 9Y by sensing them time-sharingly or parallelly. The encoders 9X, 9Y outputs the data xi and yi at the location defined by the crossing X electrodes and Y electrodes in the area 7a designated by the finger-touch operation in the form of the binary code signal.

Figure 7:
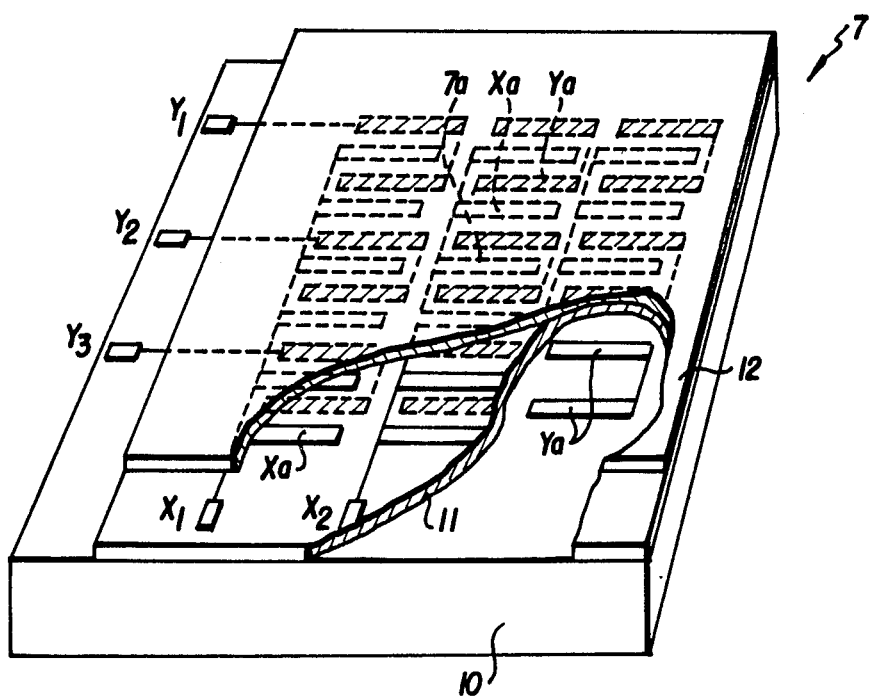
FIG. 7 is a perspective view typically indicating the electrode composition of touch panel.

FIG. 7 is a perspective view showing the electrode layout of the touch panel 7. This panel has a composition that a transparent glass plate 10 is placed as the base material, the transparent Y side detecting electrodes Y1–Y3 extending in the transverse direction are provided thereon, moreover the transparent X side detecting electrodes X1–X3 extending in the length-way direction are provided on said Y side electrodes via the insulating film 11. The upper side surface of panel is covered with a thin insulating film 12. As is obvious from the figure, both X and Y side electrodes respectively provide the touch electrode segments Xa, Ya which are arranged at the intersecting points of them in such a manner as showing the interdigited pattern and each touch area 7a is defined by these touch electrode segments. In such composition, it is also allowed to form only the touch electrode segments Xa, Ya with the transparent conductor in order to raise detection sensitivity and to form the X and Y bus conductors (X electrode, Y electrode) connecting these touch portion with a low resistance metal material such as Cr-Cu-Cr etc.

Figure 8:
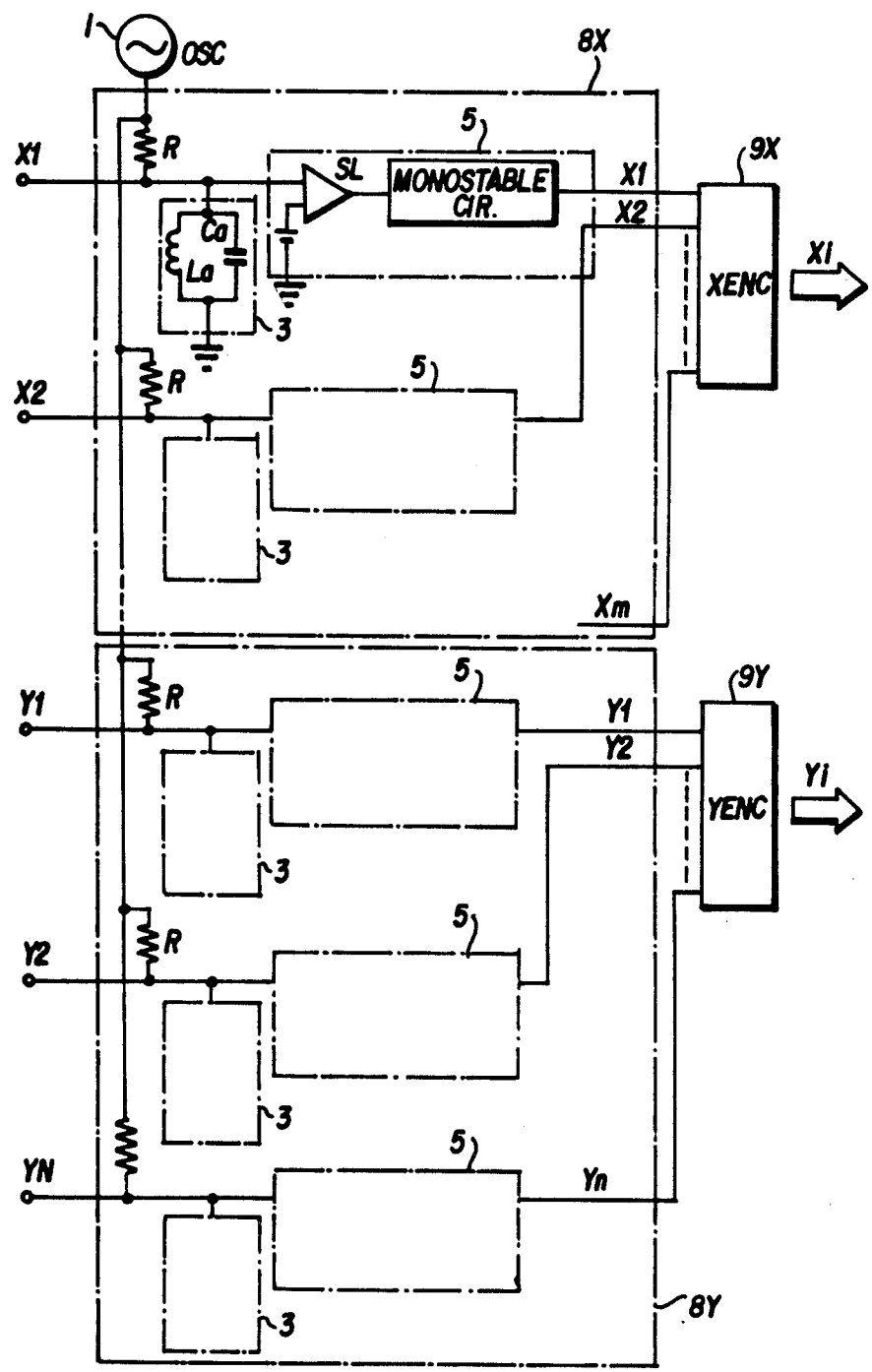
FIG. 8 is a circuit diagram indicating details of the detection signal processing circuit of FIG. 6.

FIG. 8 shows a concrete circuit diagram of the detected signal processors 8X, 8Y in the block diagram of FIG. 6, wherein the circuit for parallel sensing operation is typically shown. It is obvious from this figure that the resonant circuit 3 and the voltage detecting circuit 5 explained by referring to FIG. 2 form the sensed signal processors 8X, 8Y. Each resonant circuit 3 is connected to the common oscillating circuit 1 via the resistor R which is an impedance circuit element and the connecting point of the resistor R and resonant circuit is respectively connected with each sensing electrode. The outputs x1, x2, ..., xm of the voltage detecting circuit 5 associated with the X electrode group are input to the encoder 9X, while the outputs y1, y2, ..., yn associated with the Y electrodes are input to the Y encoder 9Y.

Here, it is supposed that an operator touches the touch with a finger the touch area 7a which is the intersecting point of the X detecting electrode $X_2$ and the Y detecting electrode $Y_2$. Before an operator touches the touch area, all resonant circuits 3 are in the resonant condition and therefore the level of the outputs x1, x2, ..., xm, y1, y2, ..., yn of all voltage detecting circuits 5 are in the high level, logic "1" and no coordinate data is output from the X side encoder 9X and Y side encoder 9Y.

When an operator touches the touch area 7a, the resonant circuits connected to the X electrode $X_2$ and Y electrode $Y_2$ are placed in the no-resonant condition from the resonant condition. As a result, only the outputs x2, y2 of the corresponding voltage detecting circuit 5 are set to the low level, logic "0". Therefore, "1, 0, 1, 1, ..., 1" is input to the X side encoder 9X and an input to the Y side encoder 9Y becomes "1, 0, 1, 1, 1, ..., 1," and the coordinate data with xi=2 in the X direction and yi=2 in the Y direction can be output.

Then, another embodiment of the present invention which has improved the ON-OFF ratio in the touch and no-touch conditions is explained below.

Figure 9:
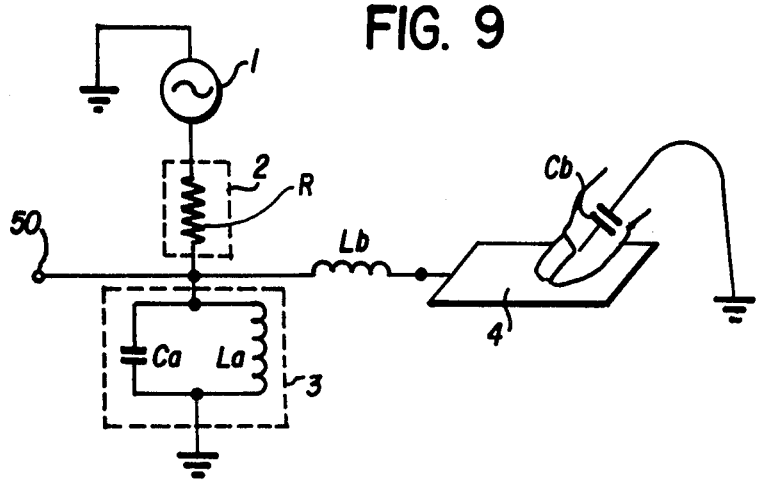
FIG. 9 is a circuit diagram indicating another embodiment of the touch sensing device of the present invention.

In FIG. 9, an oscillator 1 is connected, for example, to the resonant circuit 3 connecting in parallel the capacitor Ca and coil La via the impedance circuit 2 and moreover the resonant circuit 3 is connected to the touch electrode 4 via the inductance element Lb. Moreover, the output terminal 50 is connected to the connecting point of the impedance circuit 2 and the resonant circuit 3. This embodiment is not so different from the touch sensing device shown in FIG. 2 in such a point that touch and no-touch condition to the sensing electrode 4 is detected as a change of a voltage at the output terminal 50 in such a composition. But, the touch sensing device of FIG. 9 is largely different from that shown in FIG. 2 in the following point that an inductance element Lb is connected between the resonant circuit 3 and the touch electrode 4.

Figure 10:
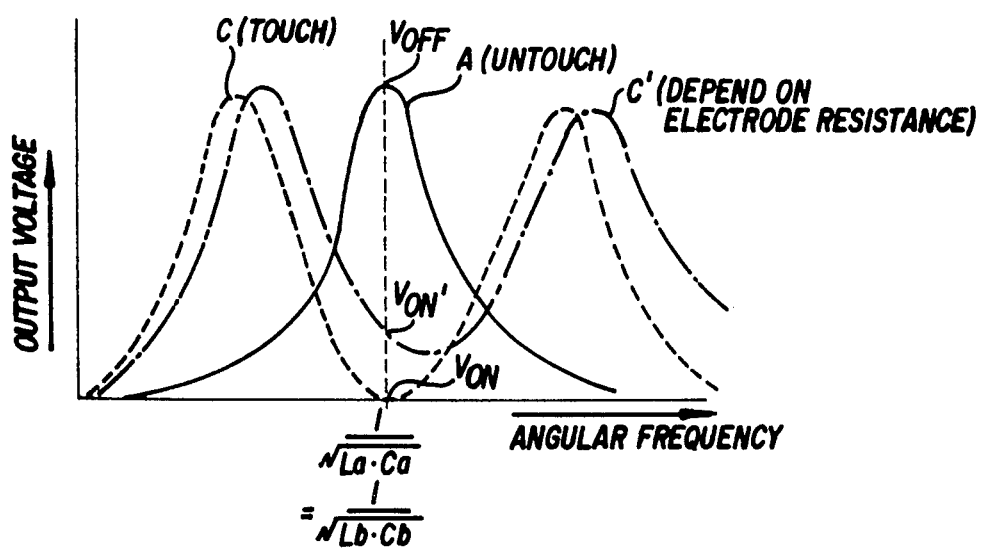
FIG. 10 is the characteristic curve indicating relation between frequency and detection output voltage of the touch sensing device of FIG. 9.

FIG. 10 shows the output voltage vs. frequency characteristic of the touch sensing device using the composite resonance shown in FIG. 9, where the angular frequency is plotted on the horizontal axis, while the output voltage of output terminal 50 on the vertical axis. The curve A of a solid line shows the characteristic in such a case where, for example, the finger does not touch the touch electrode. Moreover, the curve C of dotted line shows the characteristic where the finger touches the touch electrode 4. In this case, for example, various values are set as follow: La=Lb and Ca=Cb. When the finger does not touch the touch electrode 4, the output voltage vs. frequency characteristic shown as the curve A can be obtained and the resonant circuit 3 is in the resonant condition. Therefore, an output voltage of the output terminal 50 becomes $V_{OFF}$. However, when the finger touches, for example, the touch electrode 4, a series circuit of the inductance element Lb and body-to-ground capacitance Cb is connected in parallel to the resonant circuit 3. As indicated by the curve C in FIG. 10, in the output voltage vs. frequency characteristic, the maximum voltage can be obtained at the two points of angular frequencies.

But, for example, when respective valaues are set as Cb=Ca, Lb=La so that the frequency of oscillator 1 tunes to the resonant circuit consisting of the series connection of Cb and Lb, the output voltage $V_{ON}$ in the finger-touch condition becomes theoretically zero (V), since the resonant impedance of said series resonant circuit is zero. Accordingly, a difference of output voltages in the touch and notouch conditions can be made very large and as a result the touch condition to the detecting electrode can be sensed very stably. For instance, in the touch sensing device of the embodiment in FIG. 2, even if the body-to-ground capacitance Cb is extremely large, for example, 1000 pF (actually 50 to 100 pF), an output voltage in the touch condition when the setting frequency of the oscillator is $w_0(=1/\sqrt{La.Ca})$ cannot become zero (V).

In addition, in the touch sensing device of FIG. 9, even when the touch electrode has a resistance of up to 50 k$\Omega$, the touch condition can be detected stably. In other words, when a resistance of touch electrode in the touch sensing device of FIG. 2 is considered as r, as shown in the output voltage vs. frequency characteristic curve B' in FIG. 4, an output voltage in the touch condition in case the touch electrode has a resistance r becomes $V_{ON}'$ and a difference to the output voltage $V_{OFF}$ in the no-touch condition becomes very small. Meanwhile, in the touch sensing device using the composite resonant circuit of FIG. 9, as shown in the output voltage vs. frequency characteristic curve C' of FIG. 10, for example, even if the touch electrode has a resistance r, the output voltage $V_{ON}'$ in the touch condition becomes very small due to addition of the series resonant condition and therefore the touch condition can be sensed stably. For this reason the touch sensing device of FIG. 2 has required a low resistance of 1 to 3 k$\Omega$ and it is allowed for the composite resonant type touch sensing device of FIG. 9 to have a resistnace of detecting electrode up to about 50 k$\Omega$ as explained above. Now that, it becomes possible to form the transparent detecting electrode with a transparent conductive material having a comparatively high resistance such as indium oxide (In$_2$O$_3$) or indium tin oxide (ITO) etc. For example, such electrode results in very large effect for the composition of touch sensing panel where it is used laying on the front side of display screen of the CRT display.

Figure 11A:
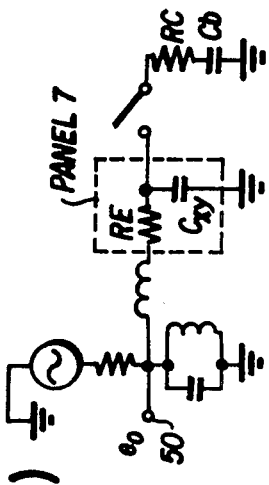
FIG. 11 is the characteristic curve indicating relation between the electrode resistance of touch panel and the ON-OFF ratio.
Figure 11B:
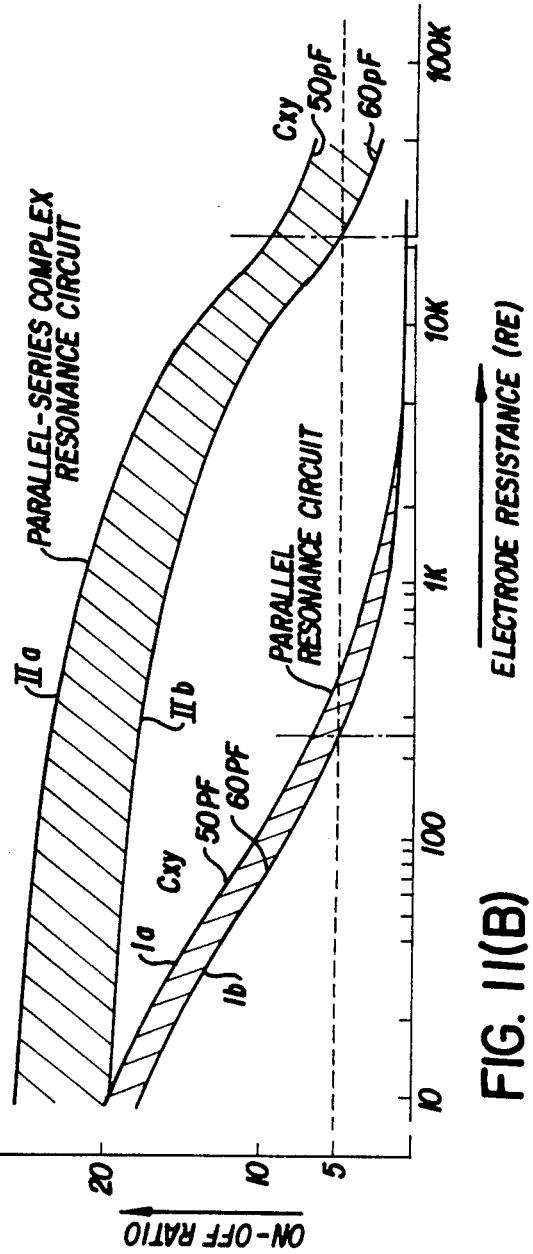

Namely, FIG. 11 shows the characteristic curve indicating the result of experimental measurement for the relation between the electrode resistance of panel and the ON-OFF ratio regarding two sensing systems of FIG. 2 and FIG. 9. The ON-OFF ratio is defined as follow with reference to a voltage of output terminal 50;

ON-OFF ratio=$V_{off}/V_{on}$ (No-touch voltage/touch voltage).

The measuring circuit is equivalently shown at the upper right of FIG. 11 with the composition of FIG. 9 as an example and the touch panel 7 is equivalently shown with the electrode resistance R$_F$ and inter-electrode capacitance C$_{XY}$. In the case of this figure, the inter-electrode capacitance C$_{XY}$ means a capacitance between one detecting electrode and the remaining all electrodes and is as large as 50 to 60 pF. Moreover, a human body capacitance Cb is estimated as 30 pF while the touch resistance R$_c$ is as 10 k$\Omega$.

The sensing circuit using only the parallel resonance as explained for FIG. 2 shows a trend that the ON-OFF ratio rapidly becomes small as the electrode resistance R$_E$ becomes large as in the case of the region between the curves Ia and Ib of FIG. 11, making very difficult the substantial sensing operation when the electrode resistance becomes 1 k$\Omega$ or more. Therefore, in case of using a sensing circuit of FIG. 2, it is desirable to keep the electrode resistance to 200 $\Omega$ or less in order to obtain the practical ON-OFF ratio of 5 or more and it is recommended to compose only the bus of the X and Y electrodes with a low resistance metal conductor as explained above.

On the other hand, the sensing circuit using the parallel-series composite resonance explained for FIG. 9 causes the ON-OFF ratio to receive lesser influence of electrode resistance as shown in the region between the curves IIa and IIb of FIG. 11, assuring the ON-OFF ratio of 10 or more in the range of the electrode resistance of 10 k$\Omega$ or less. Therefore, even in case the electrode of touch panel is composed of a transparent conductive material, the stable and reliable sensing operation is assured, since the electrode resistance is about as small as 20 k$\Omega$ or less.

Figure 12:
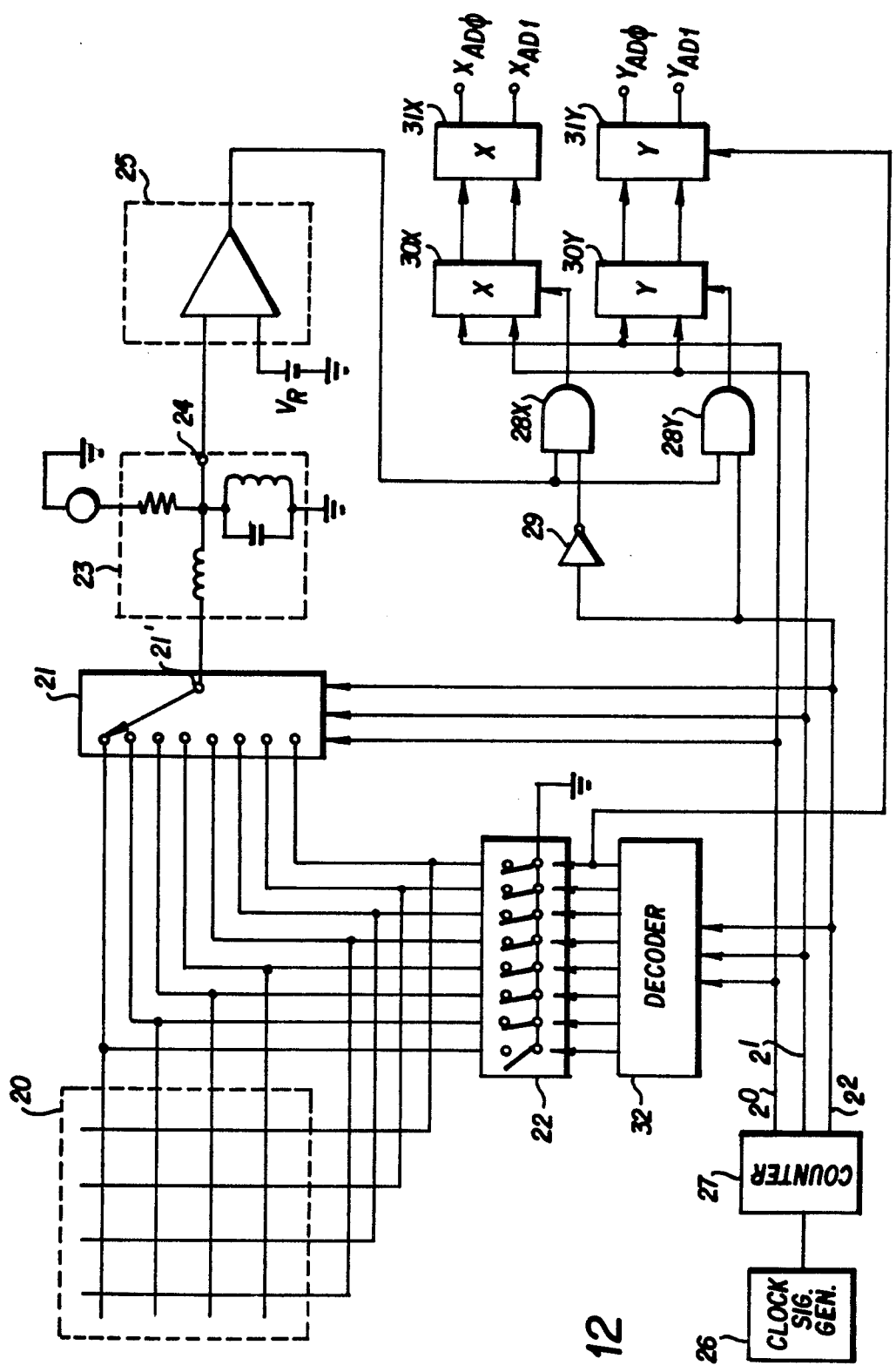
FIG. 12 is a block diagram indicating composition of touch input device utilizing the present invention.

FIG. 12 is a block diagram indicating another circuit composition of a touch input device using the present invention, wherein the touched electrodes are detected on the time sharing basis.

Namely, the touch panel 20 provides the multiplexer 21 and plurality of X and Y detecting electrodes Y1 to Y4, X1 to X4 connected to the analog swltch array 22. The output terminal 21' of multiplexer 21 is connected with the sensing circuit 23 utilizing the parallel-series composite resonant circuit explained previously regarding FIG. 9 and moreover its output 24 is connected with the comparator 25 for comparing an output voltage level with the reference voltage $V_R$. In addition, the address signal is generated by the clock signal generator 26 and the 3-bit counter 27 in order to uniquely desigante the detecting electrode connected to the detecting circuit 23. The multiplexer 21 connects one by one the detecting electrode to the detecting circuit 23 in accordance with the condition of 3-bit address signal sent from the counter 27. An output of said comparator 25 is input to a pair of AND gate circuits 28X and 28Y. The one AND gate circuit 28X outputs the touch signal to the X side electrode from matching of the signal obtained by inverting the 3-bit counter output as said address signal via the inverter 29 and the sensed signal. The other AND gate circuit 28Y also outputs the touch signal for the Y side electrode from matching of the 3-bit counter output as said address signal and the sensed signal. The outputs of these AND gate circuits 28X, 28Y are respectively once stored in the temporary registers 30X, 30Y and the address condition in such a case the touch signal is generated is stored. Contents of these temporary registers are read to the output registers 31X and 31Y when the scanning of one cycle is completed for both X and Y electrodes and are sent to the computer as the signal indicating the touches electrode position. Meanwhile, the 3-bit address signal for scanning is decoded by the decoder 32 during the electrode scanning by said multiplexer 21 and then applied to the analog switch array 22. This analog switch array operates in such a way as connecting remaining all electrodes except for only one detecting electrode connected to the sensing circuit 23 via the multiplexer 21 to the ground potential. Thereby, influence of inter-electrode capacitance can be eased by clamping the no-selected electrode to the ground potential.

As can be understood from above explanation, this invention provides a large output voltage ratio in the touch OFF and ON conditions by making use of the resonant circuit and also provides an advantage that stable and reliable touch sensing operation can be realized in case it is applied to the see-through type touch input device or touch keyboard.

We claim:

1. A touch sensing device for detecting a touched condition of a touch electrode wherein the capacitance of said touch electrode changes when said touch electrode is touched and not touched, said device comprising:
   (a) an oscillator means for generating a constant frequency AC signal;
   (b) parallel resonant circuit means, said resonant circuit means being tuned to the frequency of said oscillator means;
   (c) impedance circuit means coupling said oscillator means to said resonant circuit means;
   (d) an impedance element connected in series with said resonant circuit means, said impedance element also being connected to said touch electrode;
   (e) wherein the touched and not touched conditions of said touch electrode is detected as a change in voltage at the connecting point of said impedance circuit means and said resonant circuit means.

2. A touch sensing device as set forth in claim 1, wherein said impedance element is an inductor.

* * * * *